United States Patent [19]
Kim et al.

[11] Patent Number: 5,747,865
[45] Date of Patent: May 5, 1998

[54] VARACTOR DIODE CONTROLLABLE BY SURFACE LAYOUT DESIGN

[75] Inventors: Dong-Wook Kim; Jeong-Hwan Son; Song-Cheol Hong; Yeong-Se Kwon, all of Daejeon-shi, Rep. of Korea

[73] Assignee: Korea Advanced Institute of Science and Technology, Daijeon-Shi, Rep. of Korea

[21] Appl. No.: 802,012

[22] Filed: Feb. 18, 1997

Related U.S. Application Data

[63] Continuation of Ser. No. 507,772, Jul. 26, 1995, abandoned.

[30] Foreign Application Priority Data

Jul. 26, 1994 [KR] Rep. of Korea ............... 1994-18057

[51] Int. Cl.$^6$ ........................... H01L 29/93
[52] U.S. Cl. ............. 257/480; 257/595; 257/598; 257/599; 257/600
[58] Field of Search ................. 257/480, 594, 257/595, 598, 599, 600, 601

[56] References Cited

U.S. PATENT DOCUMENTS

| | | | |
|---|---|---|---|
| 4,721,985 | 1/1988 | Pavlidis et al. | 257/480 |
| 5,055,889 | 10/1991 | Beall | 257/480 |
| 5,276,350 | 1/1994 | Merrill et al. | 257/603 |
| 5,336,923 | 8/1994 | Geddes et al. | 257/480 |

FOREIGN PATENT DOCUMENTS 2-207573  8/1990  Japan ..................... 257/480

*Primary Examiner*—Minh-Loan Tran
*Attorney, Agent, or Firm*—Merchant, Gould, Smith, Edell, Welter & Schmidt

[57] ABSTRACT

An area-variable varactor diode is disclosed, in which the capacitance can be arbitrarily varied under an applied bias voltage. The area-variable varactor diode is characterized in that, in order to ensure freedom to designing the epi-layer, to obtain the desired capacitance characteristics, and to facilitate the integration with other elements, a steeply varied depletion layer area is provided through a variation of the surface layout area, and thus, varied capacitance characteristics are obtained. In steeply varying the area of the depletion layer, an etching of the active layer, a selective epi-layer growth, and an ion implantation are carried out or a combination of them is carried out. The capacitance characteristics are varied in accordance with the pattern of the mask, and therefore, a restriction is not imposed on the epi-layer, with the result that an integration with other elements becomes easy. Further, because the mask pattern is resorted to, it becomes possible to manufacture a varactor diode which shows a capacitance variation of a strong non-linearity and a large capacitance variation rate.

11 Claims, 8 Drawing Sheets

VARACTOR DIODE CONTROLLABLE BY SURFACE LAYOUT DESIGN

This is a Continuation of application Ser. No. 08/507,772, filed Jul. 26, 1995, now abandoned.

FIELD OF THE INVENTION

The present invention relates to a semiconductor device, and particularly to an area-variable varactor diode in which the capacitance can be arbitrarily varied under an applied bias voltage.

DESCRIPTION OF THE PRIOR ART

The conventional diode has a limit in the variation of capacitance, and the capacitance variation rate of diodes formed upon a wafer are always same, while their integration with other elements is not easy. FIG. 1 illustrates the usual P-N junction diode and a capacitance versus the applied bias voltage. The diode includes a $P^+$ layer 15, a P layer 14, an N layer 13 and an $N^+$ layer 12 which are formed upon an insulated substrate 11. When the bias voltage is zero, the width of a depletion layer(dotted line) is indicated by W in FIG. 1A. Under this condition, the capacitance becomes Cmax as shown in FIG. 1B. The capacitance is inversely proportional to the width of the depletion layer of P-N junction diode. If the reverse bias voltage is increased, the width W of the depletion layer is increased, and accordingly, the capacitance is decreased. If the reverse bias voltage is further increased, the P layer 14 and the N layer 13 are completely depleted, with the result that the width of the depleted layer becomes equivalent to the sum of the thicknesses of the P layer 14 and the N layer 13, and that the capacitance under this condition becomes Cmin as shown in FIG. 1B. The expansion of the depleted zone into the $N^+$ layer 12 and the $P^+$ layer 15 due to the bias voltage is negligible, and therefore, after the complete depletion of the P layer 14 and the N layer 13, the decrease of the capacitance is extremely small. The variation rate of the capacitance of the diode corresponds to the ratio between the capacitance Cmax (in which the bias voltage is zero) and the capacitance Cmin (in which the P layer 14 and the N layer 13 are completely depleted). Generally, the variation rate of the capacitance rarely has a value of 5 or more. Meanwhile, in the case of the same epi-layer structure, this ratio is always constant. When designing an epi-layer to obtain good diode characteristics and desirable capacitance characteristics, there can be formed a structure which is difficult to integrate with other elements. These features are seen not only in the P-N junction diode, but also in the Schottky diode in which a metal having a Schottky barrier instead of the $P^+$ layer 15 and the P layer 14 is used.

In Japanese Patent 2,207,573, the shape and concentration of the epi-layer are limited in forming a conventional varactor diode in which the width of the depletion layer is varied in accordance with the applied voltage, and the capacitance is varied accordingly. U.S. Pat. No. 4,721,985 proposes a method in which the layout of the diode is carried out in a different manner. However, the devices manufactured in this manner have a restriction imposed on the epi-layer, and therefore, the integration with other elements becomes difficult, while the variation rate of the capacitance is not sufficient.

SUMMARY OF THE INVENTION

The present invention is intended to overcome the above described disadvantages of the conventional techniques.

Therefore it is the object of the present invention to provide an area-variable varactor diode controllable by a surface layout design, in which the integration with other elements is easy, and a large variation rate of capacitance can be obtained.

In achieving the above object, the area-variable varactor diode is characterized in that, in order to ensure freedom to designing the epi-layer, to obtain the desired capacitance characteristics, and to facilitate the integration with other elements, a steeply varied depletion layer area is provided through a variation of the surface layout area, and thus, varied capacitance characteristics are provided.

The area-variable varactor diode according to the present invention in which a steeply varied depletion layer area is provided can also be realized by carrying out surface area variations on different layouts at two different positions or more of an active layer.

In steeply varying the area of the depletion layer, an etching of the active layer, a selective epi-layer growth, and an ion implantation are carried out, or two or more of them are combinedly carried out.

Examples of the area-variable varactor diode according to the present invention are the P-N junction diode and the Schottky diode. Further, the present invention includes diode arrays in which at least one of the varactor diode is disposed.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENTS

Figure 1B:
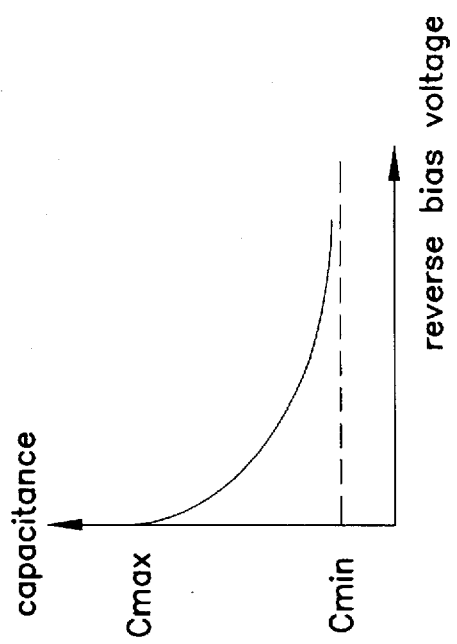
FIG. 1B is a graphical illustration of the variation of the capacitance versus the variation of the reverse bias voltage.
Figure 1A:
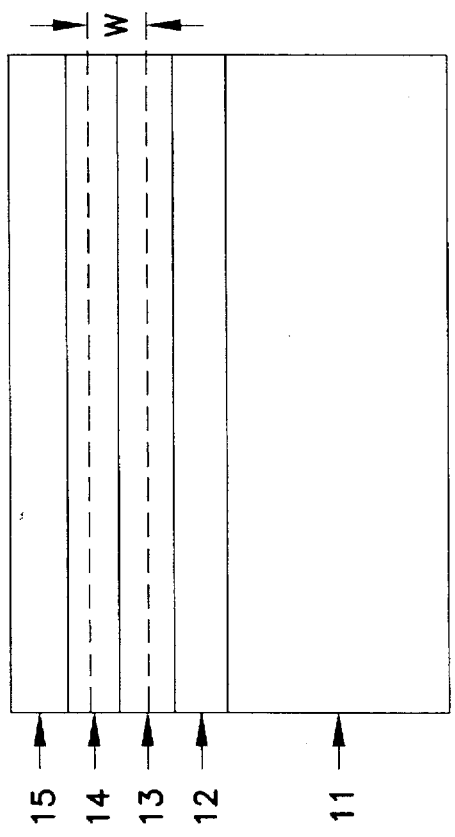
FIG. 1A illustrates the usual P-N junction diode.
Figure 2B:
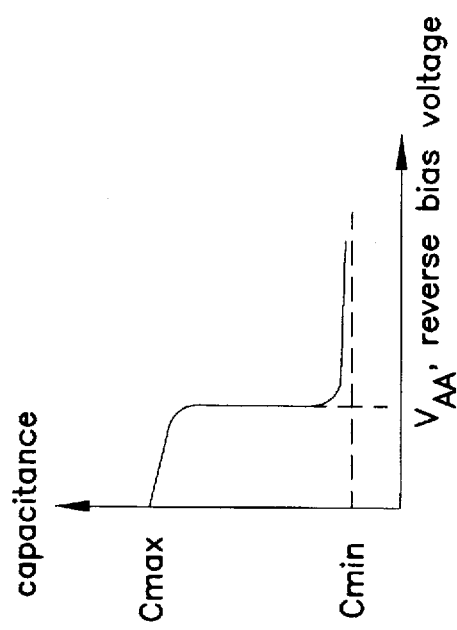
FIG. 2B graphically illustrates the variation of the capacitance versus the applied reverse bias voltage for the diode of FIG. 2A.
Figure 2A:
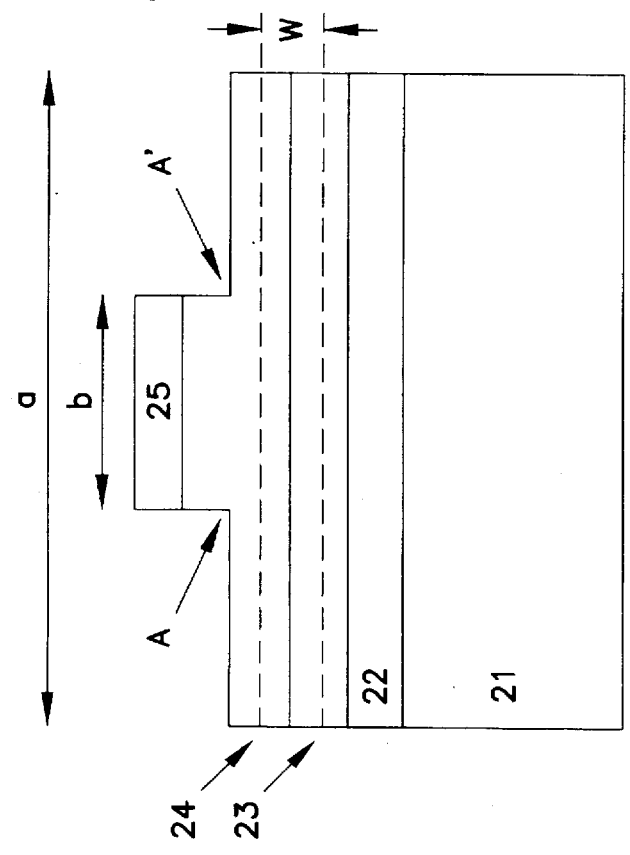
FIG. 2A illustrates a first embodiment of the area-variable varactor diode according to the present invention in which an etching process is applied.

FIG. 2 illustrates a first embodiment of the area-variable varactor diode according to the present invention in which a P+ layer 22, a P layer 23, an N layer 24 and an N+ layer 25 are formed upon an insulated substrate 21, and an etching is carried out down to a face AA' of the N layer 24 and the N+ layer 25. FIG. 2 also illustrates the variation of the capacitance versus the applied reverse bias voltage. Here, when the bias voltage is zero, the sum of the widths of the depletion layers for the P layer 23 and the N layer 24 is W, and the depletion layer is positioned near the AA' face. If the reverse bias is increased to meet the AA' face, then the area of the depletion layer is abruptly varied as shown in FIG. 2A. This area variation rate is proportional to a/b (width of an N+ layer before etching/width of an N+ layer after etching), and the capacitance is proportional to the area. Therefore, the ratio between the capacitance before passing the AA' face of the depletion layer and the capacitance after passing the AA' face is proportional to a/b. If the ratio of a to b on the layout is 10:1, the ratio of capacitances is varied in the ratio of 10. The variation of the capacitance versus bias voltage is illustrated in FIG. 2B. In FIG. 2B, $V_{AA}$, indicates the level of a bias voltage at which the depletion layer contacts with the AA' face. Thus in the method of steeply varying the area of the depletion layer by varying the area of an active layer when the width of depletion layer is varied, the capacitance characteristics can be adjusted by means of the area of the layout regardless of the epi-layer design. That is, different capacitance variation rates can be provided on a wafer. Further, a large capacitance variation rate can be easily realized, these being the major advantages of the present invention.

Figure 3A:
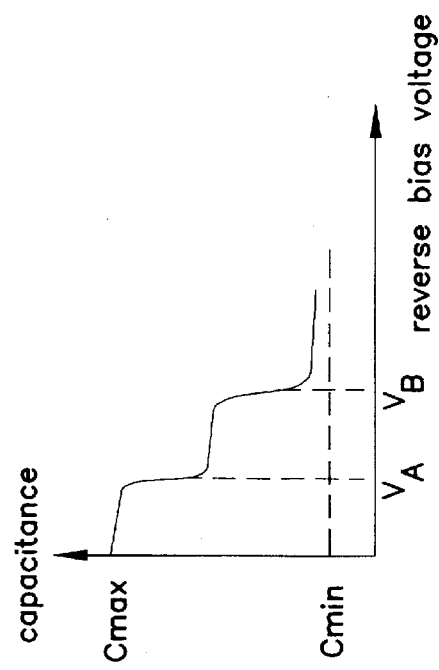
FIG. 3A illustrates a second embodiment of the area-variable varactor diode according to the present invention in which an etching process is applied.

FIG. 3 illustrates a second embodiment of the area-variable varactor diode according to the present invention in which an etching process is applied. FIG. 3 further illustrates the variation of the capacitance versus the applied reverse bias voltage for this diode. Like the diode of FIG. 2, this diode includes a P+ layer 32, a P layer 33, an N layer 34 and an N+ layer 35 formed upon an insulated substrate 31. An N type ohmic contact is formed in the hatched region of the N+ layer 35 of FIG. 3A. The depth of the etched region is determined by the width of the etched pattern of the mask, because the crystalline plane of the insulated substrate 31 is utilized.

Figure 3B:
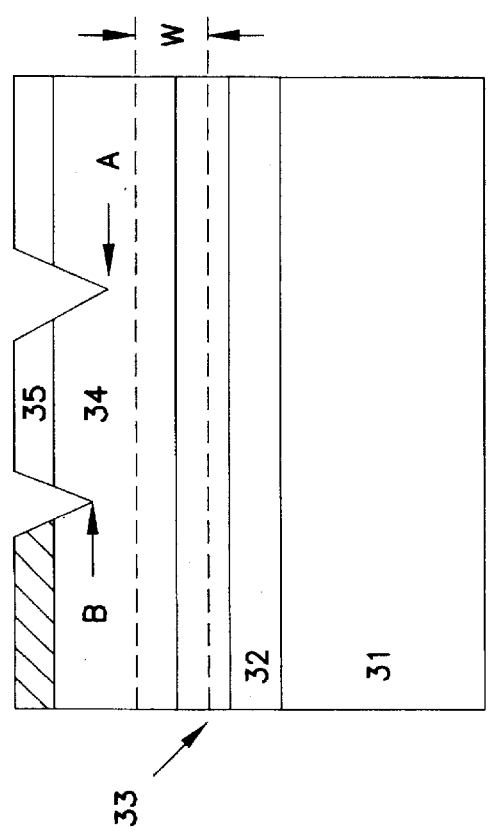
FIG. 3B graphically illustrates the variation of the capacitance versus the applied reverse bias voltage for the diode of FIG. 3A.

When the bias voltage is zero, the width of the depletion layer is W as shown in FIG. 3A, and the capacitance under this condition is Cmax. In accordance with the increase of the reverse bias voltage, W is increased, and when it passes a point A of FIG. 3A, the capacitance is decreased as much as the rightmost region. Further, when it passes a point B, the capacitance is further decreased as much as the intermediate region. These characteristics of the capacitance are shown in FIG. 3B.

If a multi-etching is carried out to different depths by utilizing the crystalline plane as shown in FIG. 3, a plurality of rounds of steep capacitance variations can be obtained.

Figure 4A:
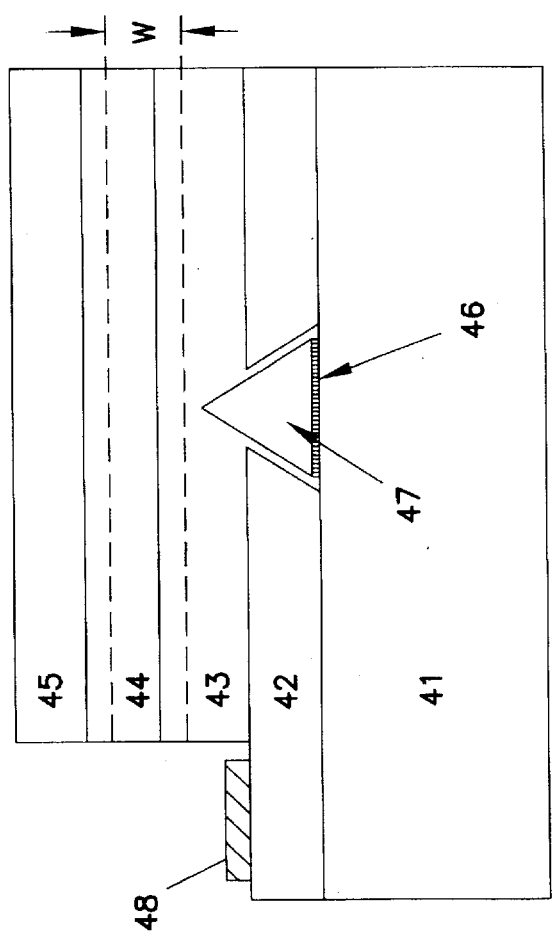
FIG. 4A illustrates a third embodiment of the area-variable varactor diode according to the present invention in which a selective epi-layer growing process is applied.
Figure 4B:
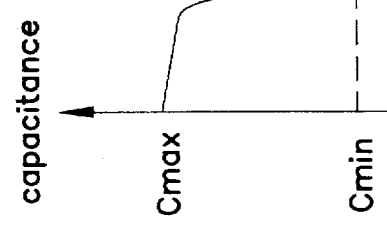
FIG. 4B graphically illustrates the variation of the capacitance versus the applied reverse bias voltage for the diode of FIG. 4A.

FIG. 4 illustrates a third embodiment of the area-variable varactor diode according to the present invention in which a selective epi-layer growing process is applied, and FIG. 4 further illustrates the variation of the capacitance versus the applied reverse bias voltage for this diode. As shown in FIG. 4A, this diode is manufactured in such a manner that a silicon dioxide layer pattern 46 is formed on an insulated substrate 41, and then, an N+ layer 42, an N layer 43, a P layer 44 and P+ layer 45 are grown thereupon. An ohmic contact 48 of the region of the N+ layer 42 is formed only on one of two regions which are divided by a triangular void 47. When the bias voltage is zero, the width of the depletion layer is W, and the width of the depletion layer is increased in accordance with the applying of the reverse bias. Thus when the peak of the void 47 which has been formed owing to the growth of the epi-layer is passed, the capacitance is decreased in accordance with the area ratio. These capacitance characteristics are shown in FIG. 4B.

Figure 5B:
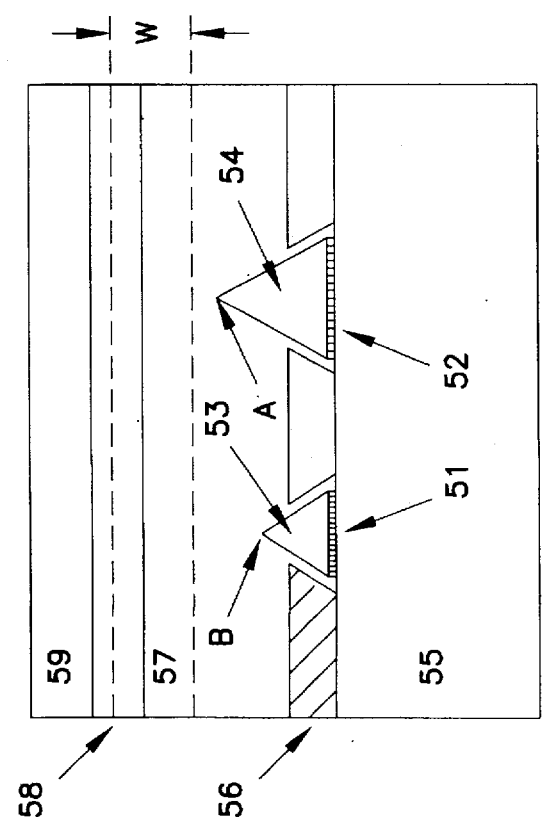
FIG. 5B graphically illustrates the variation of the capacitance versus the applied reverse bias voltage for the diode of FIG. 5A.
Figure 5A:
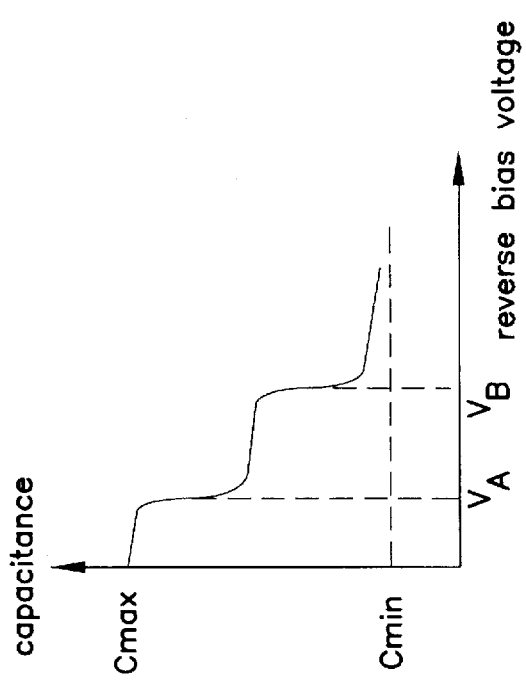
FIG. 5A illustrates a fourth embodiment of the area-variable varactor diode according to the present invention in which a selective epi-layer growing process is applied.

FIG. 5 illustrates a fourth embodiment of the area-variable varactor diode according to the present invention in which an epi-layer growing process is applied, and FIG. 5 further illustrates the variation of the capacitance versus the applied reverse bias voltage for this diode. As shown in FIG. 5A, this diode is manufactured in such a manner that silicon dioxide layers 51 and 52 having different widths are formed upon an insulated substrate 55, and then, an N+ layer 56, an N layer 57, a P layer 58 and a P+ layer 59 are formed thereupon. Here, voids 53 and 54 have different heights, and the peaks are indicated with A and B. An ohmic contact of the N+ layer 56 is formed on a hatched region which is the leftmost portion of the N+ layer 56. When the bias voltage is zero, the width of the depletion layer is W, and when the reverse bias voltage is increased, the depletion layer is expanded into the N layer 57 and the P layer 58, whereby W is increased. When the depletion layer passes the peak A of the void 54, a steep decrease occurs in the capacitance. These characteristics are shown in FIG. 5B. If the bias voltage further increases, the depletion layer passes the peak B of the void 53, and at this point, a steep decrease of the capacitance occurs. Thus, if a plurality of silicon dioxide layers of different widths are formed, and if a selective epi-layer is grown, then many rounds of transitions in the capacitance can be obtained.

Figure 6B:
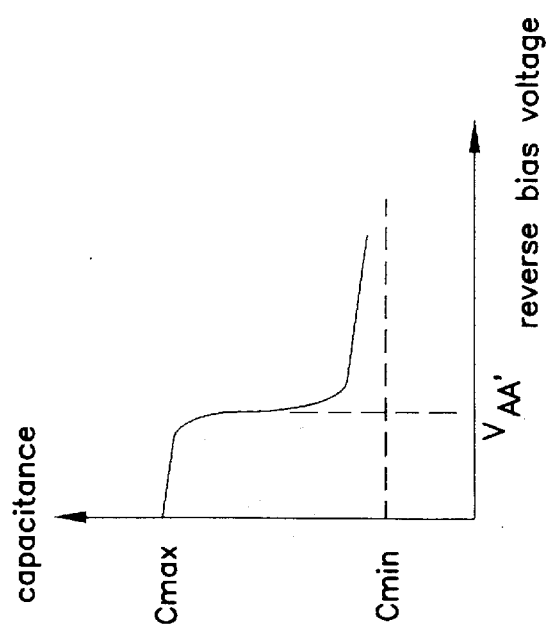
FIG. 6B graphically illustrates the variation of the capacitance versus the applied reverse bias voltage for the diode of FIG. 6A.
Figure 6A:
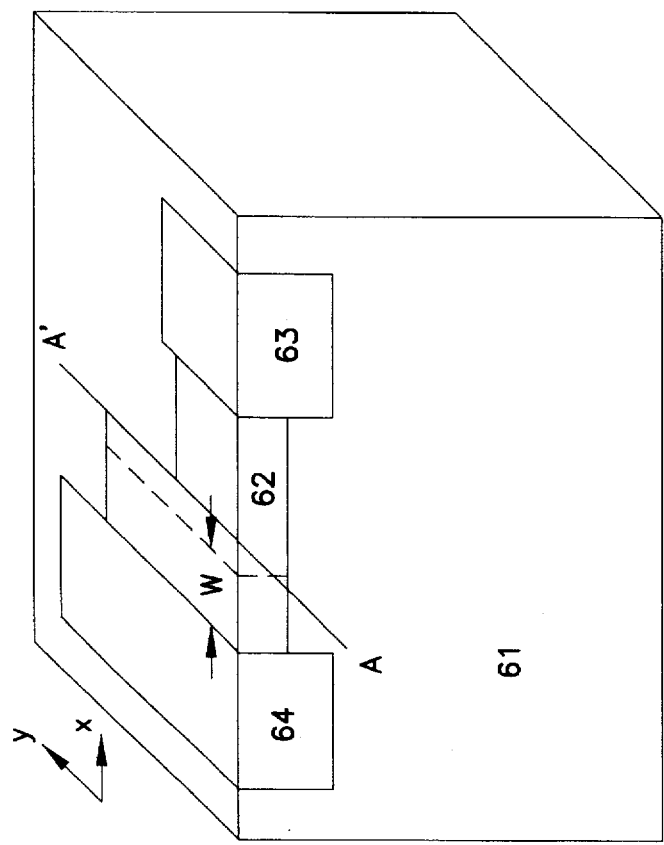
FIG. 6A illustrates a fifth embodiment of the area-variable varactor diode according to the present invention in which an ion implantation process is applied.

FIG. 6 illustrates a fifth embodiment of the area-variable varactor diode according to the present invention in which an ion implantation process is applied, and FIG. 6 further illustrates the variation of the capacitance versus the applied reverse bias voltage for this diode. This diode is manufactured in the following manner. That is, in order to form an N active layer 62 upon an insulated substrate 61, a donor impurity is ion-implanted. Then, in order to form an N+ layer 63 and a P+ layer 64, ion implantations are carried out respectively. As shown in FIG. 6A, the variation of the capacitance is realized by providing a variation of the layout area for the N active layer 62 in the direction of the expansion of the depletion layer. When the bias voltage is zero, the width of the depletion layer is W as shown in FIG. 6A. If the bias voltage is increased, the width W of the depletion layer is increased to pass the AA' face of FIG. 6A, and under this condition, the capacitance of the diode is abruptly varied. These capacitance characteristics are shown in FIG. 6B. This ion implantation process is same as the GaAs ion implantation process or the Si ion implantation process, in that the integration with other elements is easy, and that the capacitance characteristics can be realized through the shape of the layout, whereby a varactor diode suitable for a particular circuit can be easily realized.

Figure 7B:
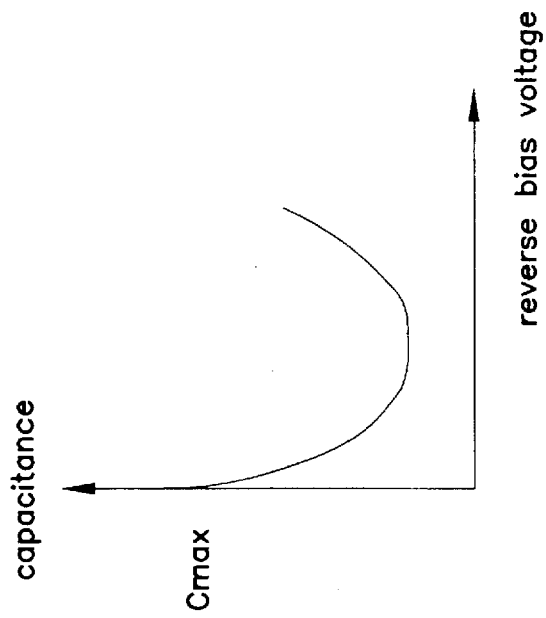
FIG. 7B graphically illustrates the variation of the capacitance versus the applied reverse bias voltage for the diode of FIG. 7A.
Figure 7A:
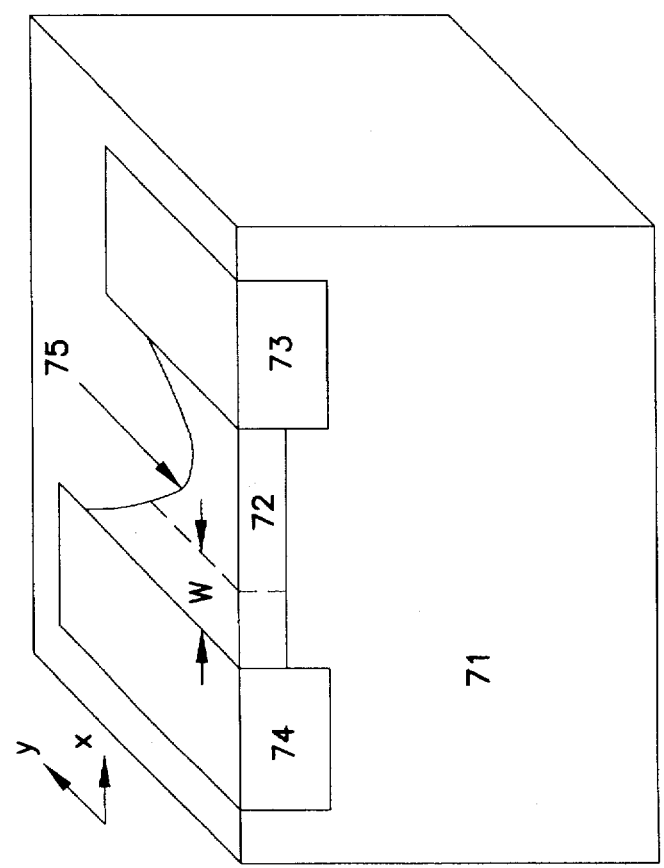
FIG. 7A illustrates a sixth embodiment of the area-variable varactor diode according to the present invention in which an ion implantation process is applied.

FIG. 7 illustrates a sixth embodiment of the area-variable varactor diode according to the present invention in which an ion implantation process is applied, and FIG. 7 further illustrates the variation of the capacitance versus the applied reverse bias voltage for this diode. This diode is manufactured in the following manner. That is, like in FIG. 6, in order to form an active layer upon an insulated substrate 71, a donor impurity is ion-implanted, thereby forming an N layer 72. Then in order to form an N type ohmic contact and a P type ohmic contact, an N⁺ layer 73 and a P⁺ layer 74 are formed. The capacitance characteristics of the diode of FIG. 7A can be adjusted in a continuous manner based on a layout function y=f(x) 75 which is for ion-implanting the N layer 72. The variation of the characteristics of the capacitance is shown in FIG. 7B as an example. Unlike the conventional diode in which the variation of the capacitance is limited, the diode which is manufactured in the above described manner makes it possible to obtain the desired capacitance characteristics through a layout contour.

Figure 8:
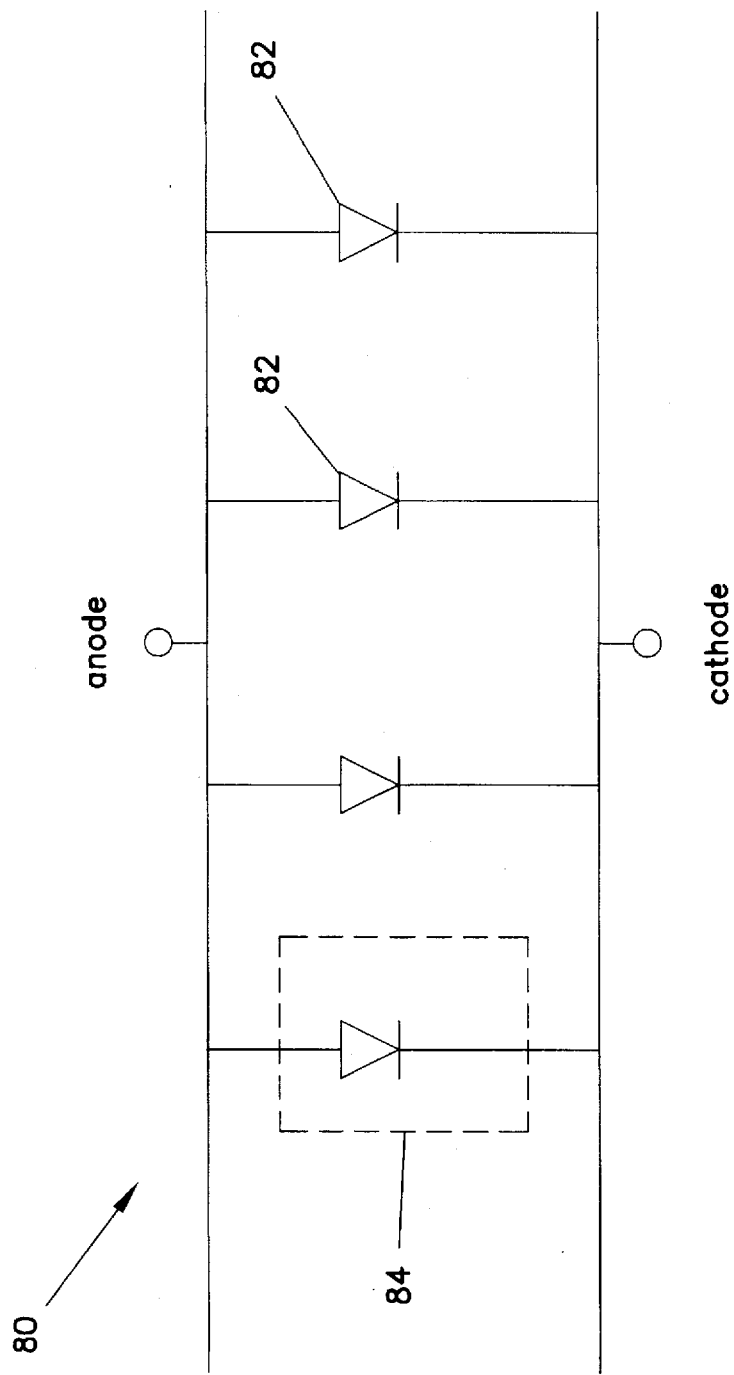
FIG. 8 illustrates an array of varactor diodes.

FIG. 8 illustrates an array 80 of varactor diodes 82, which includes at least one varactor diode according to the present invention 84.

According to the present invention as described above, the capacitance characteristics are varied in accordance with the pattern of the mask, and therefore, a restriction is not imposed on the epi-layer, with the result that an integration with other elements becomes easy. Further, because the mask pattern is resorted to, it becomes possible to manufacture a varactor diode which shows a capacitance variation of a strong non-linearity and a large capacitance variation rate.

What is claimed is:

1. An area-variable varactor diode, comprising:

a semiconductor substrate;

a doped semiconductor region on said substrate forming a diode with another region, said semiconductor region having a stepped profile so as to cause a stepped variation in depletion region area under conditions of changing voltage when a depletion region surface passes a step in said stepped profile.

2. The area-variable varactor diode of claim 1, wherein said stepped profile has two or more steps in said semiconductor region having the stepped profile.

3. The area-variable varactor of claim 1, further comprising a mesa formed in said semiconductor region.

4. The area variable varactor of claim 1, wherein semiconductor region is formed having a surface parallel to said substrate, said surface having a peripheral edge with a step so that a depletion region edge moves parallel to said semiconductor substrate and past said step under conditions of changing voltage.

5. A variable capacitance diode array, comprising:

a first diode; and an area variable varactor diode connected in parallel with said first diode, said varactor diode comprising:
a semiconductor substrate;
a doped semiconductor region on said substrate forming a junction with another region, said semiconductor region having a stepped profile so as to cause a stepped variation in depletion region area under conditions of changing voltage when a depletion region surface passes a step in said stepped profile.

6. An area-variable varactor diode, comprising:

a semiconductor substrate; and a doped semiconductor region on said substrate forming a diode with another region, said doped semiconductor region including a first non-conducting region therein so as to cause a variation in depletion region area under conditions of changing voltage when a depletion region surface passes said non-conducting region.

7. The diode of claim 6, wherein the non-conducting region is a void formed within the doped semiconductor region.

8. The diode of claim 6, further comprising a second non-conducting region in said doped semiconductor region, said second non-conducting region extending closer to said diode junction than said first non-conducting region.

9. An area-variable varactor diode, comprising:

a semiconductor substrate; and a doped semiconductor region on said semiconductor substrate forming a diode with another region at an edge thereof, said doped semiconductor region including a surface parallel to said substrate, said semiconductor region formed to have a width, said width being less at a first position away from said edge than said width at said edge, and said width being greater at a second position further from said edge than said first position than said width at said first position, so as to cause a continuous variation in depletion region area under conditions of changing voltage when a depletion region surface passes through said doped semiconductor region.

10. A variable capacitance diode array, comprising:

a first diode; and an area variable varactor diode connected in parallel with said first diode, said varactor diode comprising
a semiconductor substrate, and
a doped semiconductor region on said substrate forming a diode with another region, said doped semiconductor region having a non-conducting region with a triangular cross-section therein so as to cause a variation in depletion region area under conditions of changing voltage when a depletion region surface passes said non-conducting region.

11. A variable capacitance diode array, comprising:

a first diode; and an area variable varactor diode connected in parallel with said first diode, said varactor diode including
a semiconductor substrate; and
a doped semiconductor region on said substrate forming a diode with another region at an edge thereof, said doped semiconductor region being formed to have a width, said width being less at a first position away from said edge than said width at said edge, and said width being greater at a second position further from said edge than said first position than said width at said first position, so as to cause a continuous variation in depletion region area under conditions of changing voltage when a depletion region surface passes through said semiconductor region.

* * * * *